United States Patent [19]

Liao

[11] Patent Number: 6,028,329
[45] Date of Patent: Feb. 22, 2000

[54] BIPOLAR JUNCTION TRANSISTOR DEVICE AND A METHOD OF FABRICATING THE SAME

[75] Inventor: Chungpin Liao, Taichung, Taiwan

[73] Assignee: Industrial Technology Research Institute, Hsinchu, Taiwan

[21] Appl. No.: 08/925,357

[22] Filed: Sep. 8, 1997

[30] Foreign Application Priority Data

Jan. 28, 1997 [TW] Taiwan ................................. 86101021

[51] Int. Cl.[7] .............................................. H01L 31/0328
[52] U.S. Cl. ............................ 257/197; 257/565; 438/309
[58] Field of Search .................................. 438/378, 512, 438/520, 928, 170, 189, 202, 203, 204, 234, 235, 236, 309, 313, 322, 325, 327, 336; 257/197, 205, 273, 423, 427, 477, 526, 552, 565

[56] References Cited

U.S. PATENT DOCUMENTS

| | | | |
|---|---|---|---|
| 3,967,982 | 7/1976 | Arndt et al. ............................. | 438/512 |
| 3,979,230 | 9/1976 | Anthony et al. ......................... | 438/415 |
| 4,590,664 | 5/1986 | Prentice et al. ......................... | 438/328 |
| 4,662,058 | 5/1987 | Cirillo, Jr. et al. ..................... | 438/168 |
| 4,806,497 | 2/1989 | Adam et al. ............................ | 438/139 |
| 4,837,117 | 6/1989 | Lesk et al. .............................. | 438/309 |
| 5,755,759 | 5/1998 | Cogan ..................................... | 607/116 |

OTHER PUBLICATIONS

Wolf, S.; Silicon Processing the for the VLSI Era vol. 2: Process Integration, Lattice Press, Sunset Beach, CA, p. 273, Jan. 1990.

*Primary Examiner*—John F. Niebling
*Assistant Examiner*—Christopher Lattin
*Attorney, Agent, or Firm*—Ladas & Parry

[57] ABSTRACT

A novel bipolar junction transistor device and a method of fabricating the same are proposed. In accordance with the present invention, a p-type silicon substrate is vertically all-through transmuted into an n-type region locally by using neutron transmutation doping, such that the epitaxy layer and buried layer used in conventional BJT devices can be replaced and isolation between devices can be easily achieved. Consequently, the present invention is characterized by a higher voltage rating than that which can be achieved isolation; and the present invention is also characterized as having compatibility with the MOS.

27 Claims, 6 Drawing Sheets

BIPOLAR JUNCTION TRANSISTOR DEVICE AND A METHOD OF FABRICATING THE SAME

BACKGROUND OF THE INVENTION

1. Field of the Invention

The present invention relates to a novel bipolar junction transistor (BJT) device and a method of fabricating the same, and more particularly, relates to a method which can create lithographically defined, vertically all-through n-type region on an originally p-type silicon substrate. Such a vertically all-through n-type region can replace the expitaxy layer and buried layer applied in fabricating BJT devices.

2. Description of the Related Art

MOS transistors are general devices applied in the design and fabrication of integrated circuits, because of their low power dissipation and high integration density. However, the voltage rating, operating frequency (speed), and current driving capacity of MOS transistors cannot compare with those of BJT devices. Therefore, in some applications of integrated circuits requiring a high voltage rating, high operating speed, and large current driving capacity, most integrated circuits, such as power transistor ICs, RF ICs and power switch ICs, etc. are made of BJT devices.

Though conventional BJT ICs have high voltage ratings, the area of the isolation region is quite large. Furthermore, during the process of fabricating conventional BJT devices, buried layers and epitaxy layers must be formed, and the dopant of the buried layer may diffuse out, so that the epitaxy layer incurs auto-doping of the dopant during the growth process. Further, the cost for growing an epitaxy layer in conventional BJT devices is high, and the throughput is low.

Referring to FIG. 1A to FIG. 1E, a process for fabricating a conventional NPN IC BJT device is shown in cross section view. First, a mask layer 2 is formed on a semiconductor p-type substrate 1. The mask layer 2, for example, can be an oxide layer with a thickness of between 50~100 Å. The mask layer 2 is patterned by a photolithography process, and then is etched to form an opening 3, locally revealing the p-type substrate 1, as shown in FIG. 1A. The implantation by using arsenic ions with a flux density of about $10^{15}$ atoms/cm$^2$ and with an energy of about 30 K eV is carried out, thereby forming an n$^+$ diffusion region serving as a buried layer 4 in the p-type substrate 1 at opening 3. After implantation, the mask layer 2 is removed, as depicted in FIG. 1B. An n-type lightly doping epitaxy layer 5 with a doping concentration of about $10^{15}$~$10^{16}$ atoms/cm$^3$ is formed over the buried layer 4 and the p-type substrate 1. If the BJT device is for low voltage applications then the thickness of the epitaxy layer 5 is about 1~10 μm, and if the BJT device is for high voltage applications then the thickness of the epitaxy layer 5 is about 10~500 μm. An oxide layer 6 is further formed over the epitaxy layer 5. The oxide layer 6 is patterned by a photo-lithography process and then is etched to form openings 7, as depicted in FIG. 1C. Then, boron ions are driven into the epitaxy layer 5 through the openings 7 such that p-type diffusion regions 8 are formed, serving as isolation regions, wherein the diffusion regions 8 extends into the p-type substrate 1, as depicted in FIG. 1D. Finally, a p-type base region 9, n-type collector regions 10, and an n$^+$-type doped polysilicon layer 11 are formed respectively, thereby completing the process for fabricating the conventional NPN IC BJT, as depicted in FIG. 1E.

Clearly, the conventional NPN BJT fabricated by the method (prior art) described above has the following drawbacks.

First, a junction capacitor $C_{sub}$ (not shown) exists between the buried layer 4 and the p-type substrate 1, and thus the operating speed of the BJT will be limited.

Second, out-diffusion and auto-doping problems are induced, and thus the epitaxy layer will be corrupted, during the growth period of the epitaxy layer, as described above.

Third, in the prior art, the n-type epitaxy layer is isolated from the p-type diffusion regions and the p-type silicon substrate. In general, the p-type diffusion regions for isolation formed in the epitaxy layer always pass through the epitaxy layer to the p-type substrate. The thickness of the epitaxy layer is thick for high voltage rating applications. Therefore, the diffusion region for isolation is also great. Consequently, the lateral diffusion width of the diffusion region also becomes large, such that the control of device dimension becomes more complicated and the device integrity of integrated circuit is reduced. The trench isolation commonly used in the prior art, is only appropriate for BJT devices operating at low voltages. For trench isolation, a trench of deep depth must be formed first, and then oxide or a polysilicon layer is grown to fill the trench. Such trench isolation is very difficult to implement and costly, especially for deep trenches. Further, lattice defects in the epitaxy layer and substrate will be induced.

Fourth, for the applications of high power and/or high voltage rating BJT devices, thicker epitaxy layers are required. However, the process for growing an epitaxy layer is costly and the throughput of epitaxy layer is low, so growing an epitaxy layer is not economical to fabricate BJT devices for high power and high voltage rating applications.

Fifth, in the prior art, another way of isolation is to use local oxidation of silicon, LOCOS, but this cannot provide complete isolation for IC BJT devices of great longitudinal depth (thick epitaxy layer).

Sixth, the structural topology of BJT devices is vertical and thus an epitaxy layer is required. The topology of the MOS transistor is horizontal, and not requiring epitaxy layer. Therefore, the way for incorporating the processes of fabricating a BJT device with that of fabricating a MOS transistor is very difficult.

SUMMARY OF THE INVENTION

In view of the above problems, the present invention proposes a novel BJT device and a method of fabricating the same. The present invention makes use of local neutron transmutation doping to create a vertically all-through n-type region on an originally p-type silicon substrate, in place of the epitaxy layer and buried layer used in the prior art. Consequently, not only are out-diffusion and auto-doping problems occurring in prior art solved, but also the time and cost for growing epitaxy layer can be saved. Moreover, the BJT device fabricated according to the present invention has the following characteristics: a high voltage rating, high operating frequency, and its fabricating process can be combined with the MOS process.

Natural silicon (Si) consists of three types of isotope, Si$^{30}$ (3.1%), Si$^{29}$ (4.6%), and Si$^{28}$ (92.3%). Neutron transmutation doping creates a vertically all-through n-type region on an originally p-type silicon substrate by using thermal neutron beam irradiation. The silicon irradiated by thermal neutron beam will generate the following reaction:

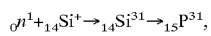

wherein the isotope $_{14}$Si$^{30}$ is collided by neutron $_0$n$^1$ and becomes unstable $_{14}$Si$^{31}$, and then the unstable $_{14}$Si$^{31}$ releases an electron and transmutes into stable $_{15}P^{31}$ (phosphorous). Therefore, 3.1% of the silicon is transmuted into $_{15}Si^{31}$. After annealing, the original p-type silicon irradiated by neutron beam is equivalent to lightly doped n-type silicon.

In order to achieve the above objects, a method of fabricating a novel bipolar transistor device comprises the steps.

(a) A protection layer and a mask layer are formed over a p-type silicon substrate in sequence, wherein the thickness of the p-type substrate can be controlled by grinding the substrate. The protection layer used for maintaining the clearness of the p-type substrate can be selected from one of the $Si_3N_4$ layer, $SiO_2$ layer, and photoresist layer. The mask layer, used to absorb the neutrons, can be selected from one of the gadolinium (Gd) metal layer, cadmium (Cd) metal layer, and the combination of both.

(b) After patterning the mask layer by a photolithography process, a portion of the mask layer is removed to reveal the protection layer locally.

(c) Neutron transmutation doping is carried out such that the part of said p-type substrate, beneath the opening, is transformed into an n-type substrate region. The hot neutrons emitting from a neutron source, such as atomic reactor or accelerator, have an energy of about 1/40 eV and a flux density of about $10^{12}$~$10^{14}$ neutrons/$cm^2$ sec.

(d) The mask layer and the protection layer are removed, and then an annealing process is carried out.

(e) Finally, a p-type diffusion region as a base region, and at least one n-type diffusion region as a collector region are formed in the n-type substrate region, and an $n^+$-type region is formed in the base region as an emitter region, thereby fabricating a bipolar junction transistor. The emitter region can be an $n^+$-type doped polysilicon layer, or an $n^+$-type diffusion region.

Referring to FIG. 2D, the BJT device, fabricated according to the present invention, comprises an n-type Si substrate region 24 surrounded by an original p-type Si substrate 20; a p-type diffusion region 25 serving as a base region and at least an n-type diffusion region 26 serving as a collector, formed on the n-type Si substrate region 24; and an n-type doped polysilicon 26 or an n-type diffusion region formed on the p-type diffusion region 25 serving as a emitter.

Referring to FIG. 3D, the above BJT device further comprises an $n^+$-type back diffusion layer 37 on the n-type Si substrate region 36, for high power and high voltage applications.

BRIEF DESCRIPTION OF THE DRAWINGS

Other objects, features and advantages of the present invention will become apparent by way of the following detailed description of the preferred but non-limiting embodiments. Description is made with reference to the accompanying drawings.

DETAILED DESCRIPTION OF THE INVENTION

First Embodiment

Referring to FIG. 2A~2D, a process for fabricating a novel BJT according to one preferred embodiment of the present invention is illustrated in cross sectional view. A method of fabricating a novel BJT device, applied to a p-type semiconductor Si substrate 20, comprises the following steps.

Step (a)

Figure 1A:
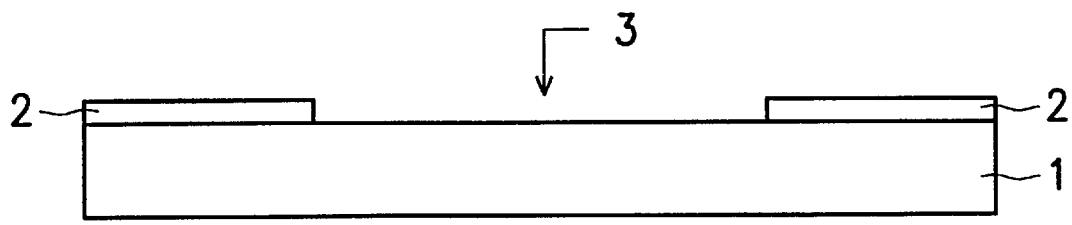
FIG. 1A to FIG. 1E schematically illustrate, in cross sectional view, a fabrication process of a conventional NPN BJT.
Figure 1B:
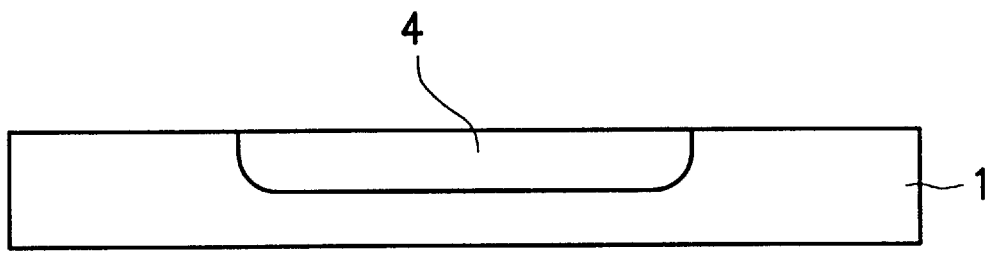
Figure 1C:
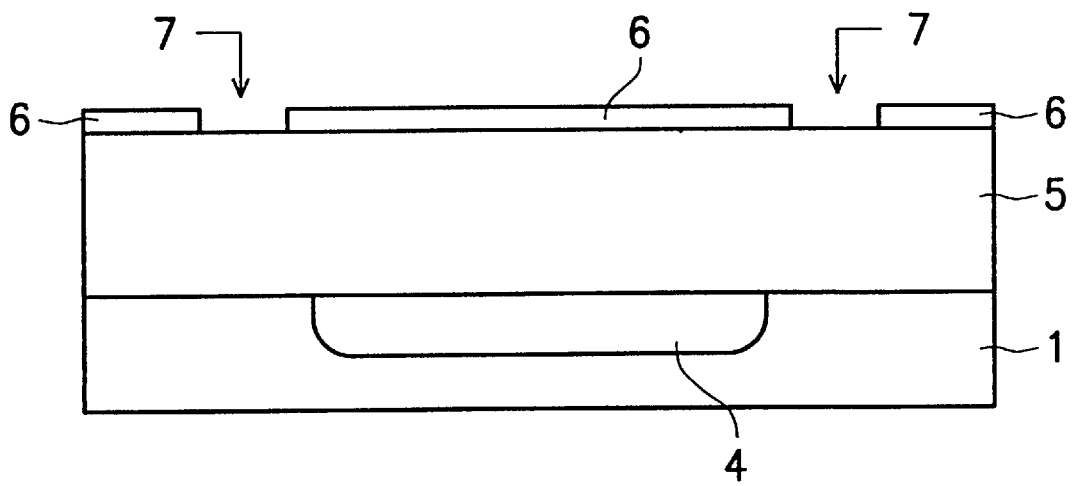
Figure 1D:
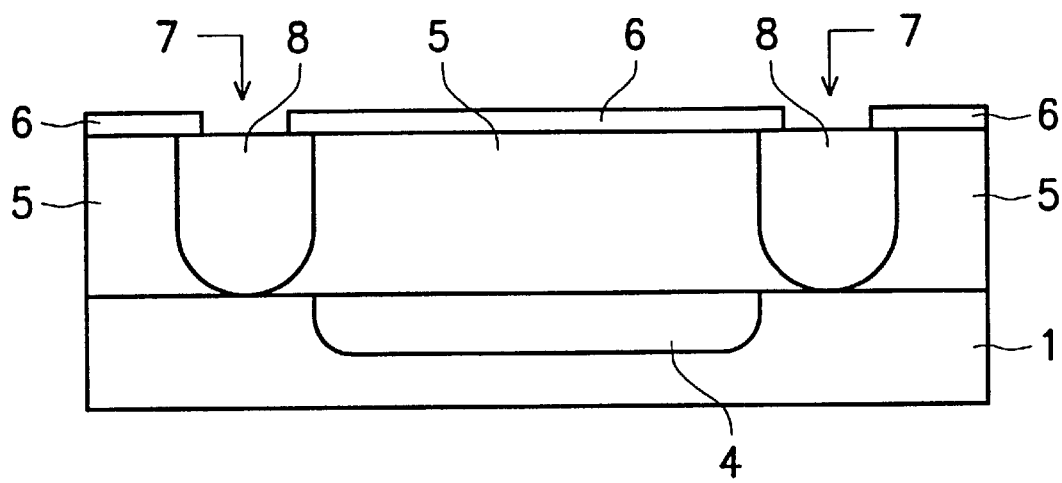
Figure 1E:
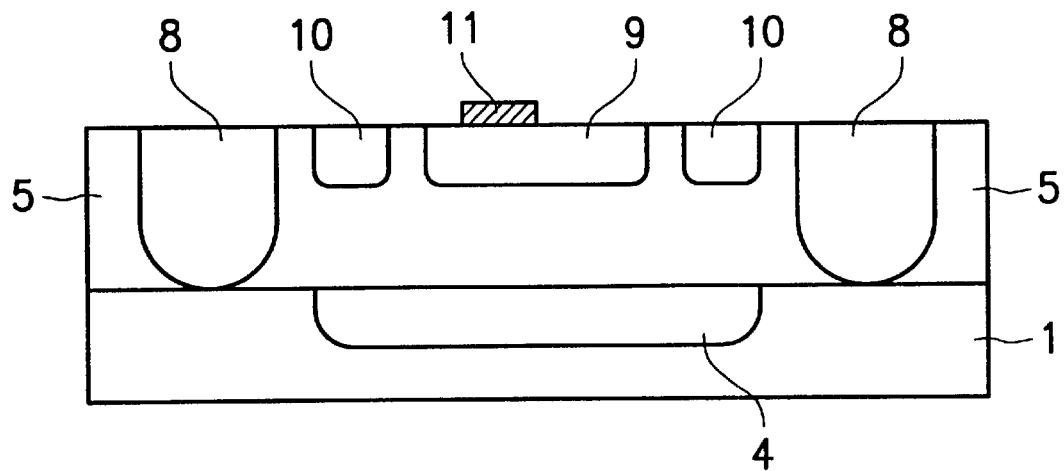
Figure 2A:
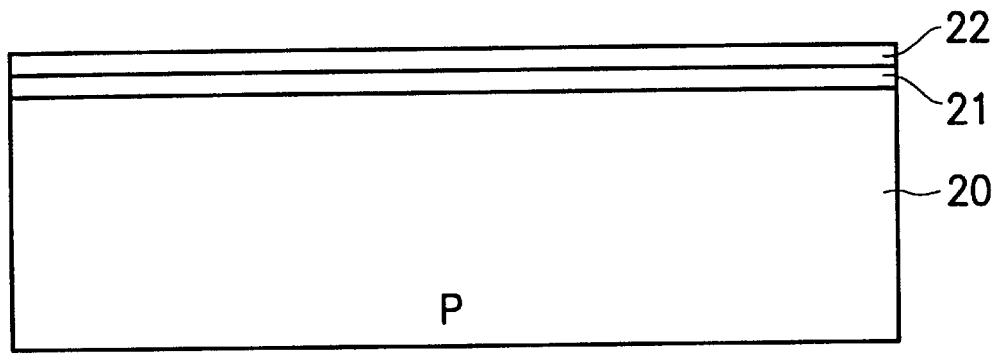
FIG. 2A to FIG. 2D schematically illustrate, in cross sectional view, a process for fabricating a novel BJT according to one preferred embodiment of the present invention.

A protection layer 21 and a mask layer 22 are formed on the p-type Si substrate 20 in sequence, as shown in FIG. 2A. For example, a $Si_3N_4$ layer 21 and a Gd metal layer 22 are subsequently formed on the p-type Si substrate 20, wherein $Si_3N_4$ layer 21 is formed by using LPCVD method.

Step (b)

Figure 2B:
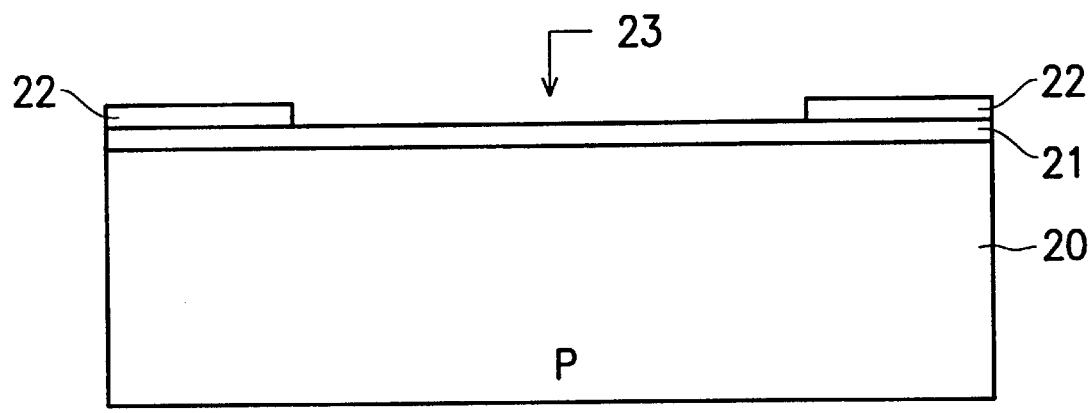

A portion of the Gd metal layer 22 is removed and thus an opening 23 is formed to reveal a portion of the $Si_3N_4$ layer 21, as shown in FIG. 2B. The Gd metal layer 22 was patterned first by using a photolithography process, and then the region not covered with photoresist was etched by acidic solution or by using plasma etching to create the opening 23.

Step (C)

Figure 2C:
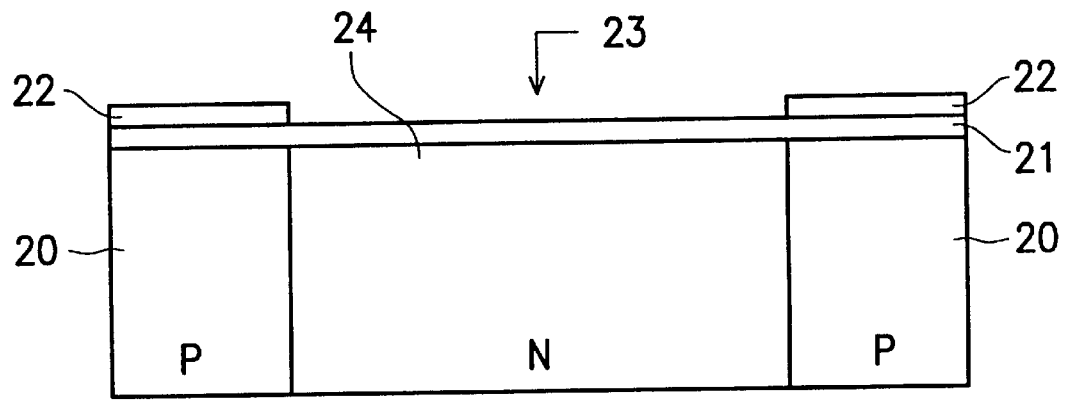

The neutron transmutation doping process is carried out. The region where the original p-type substrate 20 is not covered with Gd metal 22 will be vertically all-through transformed into an n-type substrate region 24, as shown in FIG. 2C.

Step (d)

The residual Gd metal layer 22 and the $Si_3N_4$ layer 21 are removed and then an annealing process is carried out.

Step (e)

Finally, a p-type diffusion region 25 serving as a base regions, and one or more n-type diffusion region 26 serving as collector regions are formed on the n-type Si substrate 24 respectively. Further, a $n^+$-type doped polysilicon layer 27 serving as an emitter region is formed on the base region.

Figure 2D:
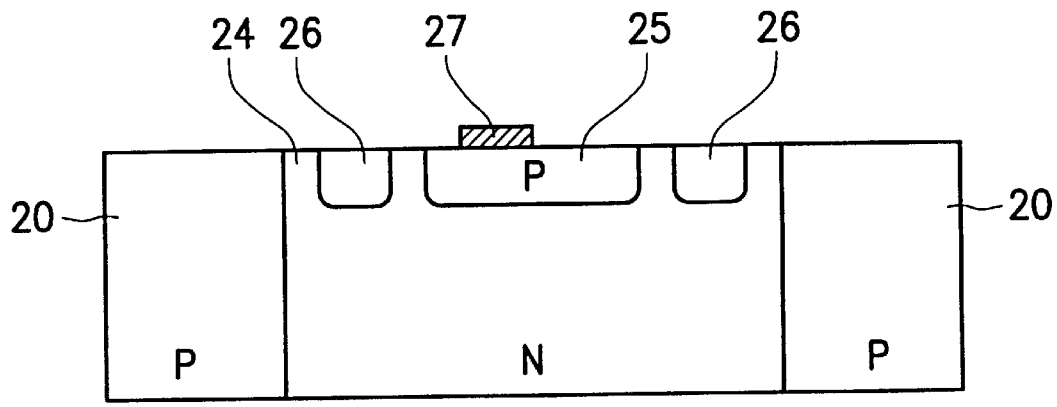

Accordingly, a novel BJT device according to the present invention is obtained, as shown in FIG. 2D, wherein the emitter can also be made by forming a $n^+$-type diffusion region (not shown in FIG. 2D) in the base region 25 as an alternative.

Second Embodiment

Referring to FIG. 3A~3D, a process for fabricating a novel BJT according to another preferred embodiment of the present invention is illustrated in cross sectional view. In this embodiment, a back diffusion region is further comprised, for fabricating BJT devices more appropriate for high power and high voltage applications. The steps are as follows.

Step (a)

Figure 3A:
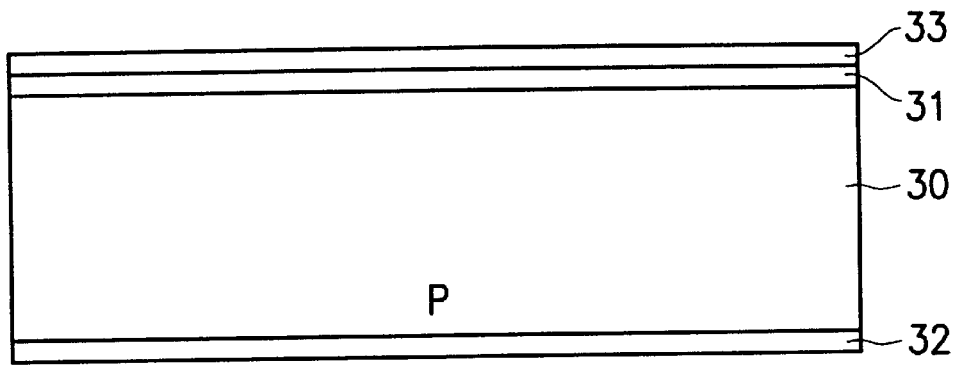
FIG. 3A to FIG. 3D schematically illustrate, in cross sectional view, a process for fabricating a novel BJT according to another preferred embodiment of the present invention.

Two protection layers 31 and 32 are formed on the front and back sides of the p-type Si substrate 30, and a mask layers 33 is formed on the front protection layers 31, as shown in FIG. 3A. For example, the protection layers 31 and 32 are $Si_3N_4$ layers and the mask layer 33 is a Gd metal layer, wherein $Si_3N_4$ layer 21 is formed by using the LPCVD method.

Step (b)

Figure 3B:
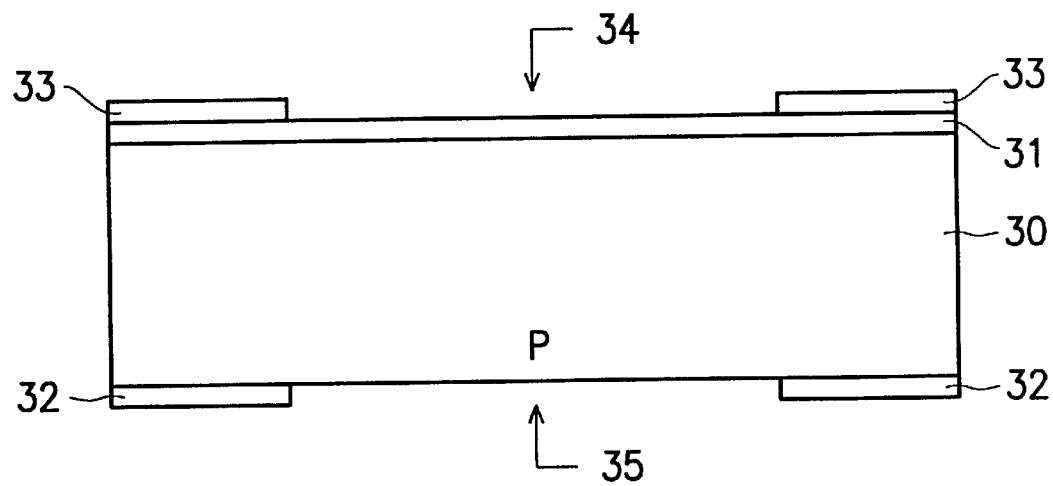

By using a dual-side infrared lithography process, the regions, where the openings 34 and 35 will be formed, are patterned. Then, the openings 34 and 35 are formed by locally removing the Gd metal layer 33 and the protection layer 32 at the back side of the p-type Si substrate 30, as shown in FIG. 3B.

Step (C)

Figure 3C:
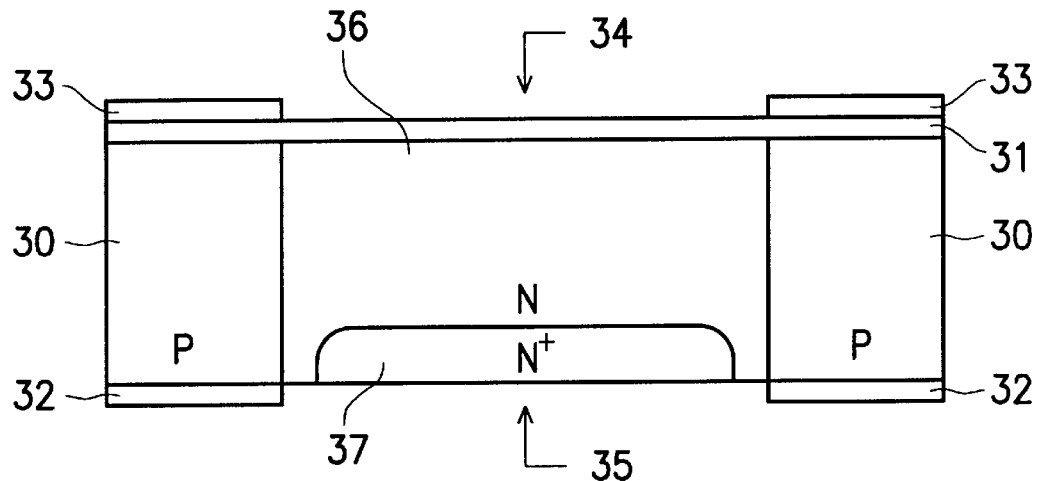

The neutron transmutation doping process is carried out. The region where the original p-type substrate 30 is not covered with Gd metal 33 will be vertically all-through transformed into an n-type substrate region 36. Then, a $n^+$-type back diffusion region 37 is formed to serve as a buried layer, as shown in FIG. 3C.

Step (d)

The residual Gd metal layer 33 and the $Si_3N_4$ layer 31 and 32 are removed and then an annealing process is carried out.

Step (e)

Finally, a p-type diffusion region 38 serving as a base region, and one or more n-type diffusion region 39 serving as collector regions are formed on the n-type Si substrate 36 respectively. Further, an $n^+$-type doped polysilicon layer 40 serving as an emitter region is formed on the base region.

Figure 3D:
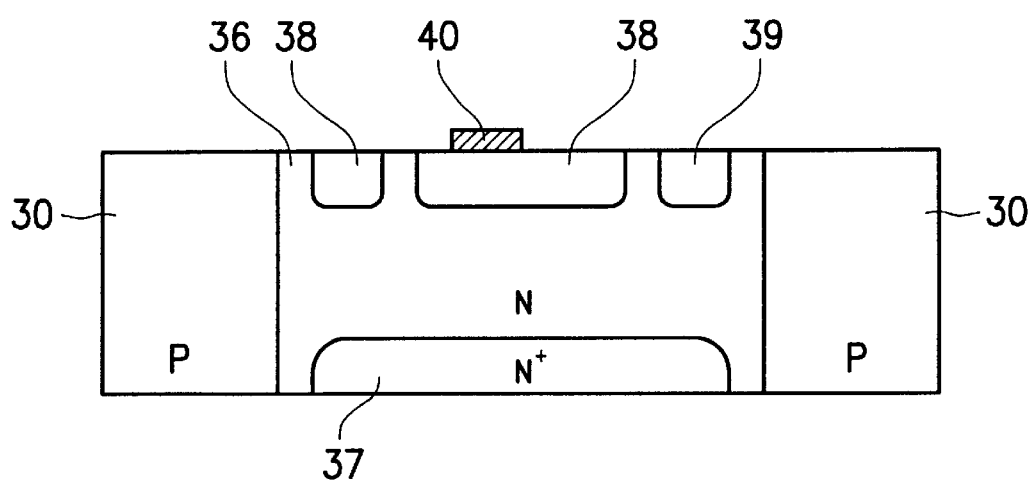

Accordingly, a novel BJT device according to the present invention is obtained, as shown in FIG. 3D, wherein the emitter can also be made by forming a $n^+$-type diffusion region (not shown in FIG. 3D) in the base region 25 as an alternative.

In accordance with the present invention, by using neutron transmutation doping, a vertically all-through n-type region can be formed in an original p-type substrate region such that the epitaxy layer used in the prior art can be replaced. Further, a back diffusion region can be formed to serve as a buried layer without suffering out-diffusion and auto-doping problems induced in the prior art. The advantages of the present invention are as follows.

First, without an epitaxy layer, out-diffusion and auto-doping problems will not be induced, and the cost of fabrication can be reduced.

Second, the parasitic junction capacitance between the buried layer and the p-type Si substrate is eliminated, and the operating speed of the BJT device is thereby improved.

Third, from experiment, the BJT device fabricated according the present invention has a voltage rating up to about 2000 V.

Fourth, the portion of the original p-type Si substrate that is not transmuted into n-type region, can be provided for fabricating MOS devices without additional processing, and therefore the complexity for integration of the BJT and MOS processes can be reduced. Further, the MOS devices formed in the p-type substrate are naturally isolated from the BJT devices formed in the n-type substrate.

Fifth, the need for utilizing an isolation method, such as deep diffusion isolation, trench isolation, and LOCOS isolation is eliminated, and thus the process can be simplified and the dimension of the active region can be more easily controlled.

While the invention has been described in terms of what is presently considered to be the most practical and preferred embodiments, it is to be understood that the invention need not be limited to the disclosed embodiments. On the contrary, it is intended to cover various modifications and similar arrangements included within the spirit and scope of the appended claims, the scope of which should be accorded the broadest interpretation so as to encompass all such modifications and similar structures.

What is claimed is:

1. A method of fabricating a bipolar transistor device comprising the steps of:
   (a) forming a protection layer and then a mask layer over a p-type silicon substrate having a top side and a bottom side;
   (b) forming an opening by removing a portion of said mask layer to reveal said protection layer, wherein a part of said p-type substrate is beneath the opening;
   (c) carrying out neutron transmutation doping such that the part of said p-type substrate beneath the opening is vertically all-through transformed, from the top side of the p-type substrate to the bottom side of the p-type substrate, into an n-type substrate region;
   (d) then removing said mask layer and said protection layer, and then carrying out an annealing process; and
   (e) forming in said n-type substrate region a p-type diffusion region as a base region and at least one n-type diffusion region as a collector region, and forming an $n^+$-type region in said base region as an emitter region, thereby fabricating a bipolar junction transistor.

2. The method as claimed in claim 1, wherein said n-type substrate region has a top side and a bottom side, the method further comprising: forming an $n^+$-type back diffusion region in the bottom side of said n-type substrate region, after the neutron transmutation doping.

3. The method as claimed in claim 1, wherein the neutron transmutation doping is carried out by using a neutron source, with an energy of about 1/40 eV and a flux density of between $10^{12}$ and $10^{14}$ neutrons/cm$^2$ sec, generated from an accelerator or an atomic reactor.

4. The method as claimed in claim 1, wherein said mask layer is a gadolinium layer with thickness of between 1 and 5 $\mu$m.

5. The method as claimed in claim 1, wherein said mask layer is a cadmium layer with thickness of between 1 and 100 $\mu$m.

6. The method as claimed in claim 1, wherein said mask layer is a combination, with a thickness of between 1 and 100 $\mu$m, containing cadmium and gadolinium.

7. The method as claimed in claim 1, wherein said protection layer is a $Si_3N_4$ layer.

8. The method as claimed in claim 1, wherein said protection layer is a $SiO_2$ layer.

9. The method as claimed in claim 7, wherein said protection layer is formed by using low-pressure chemical vapor deposition.

10. The method as claimed in claim 8, wherein said protection layer is formed by using low-pressure chemical vapor deposition.

11. The method as claimed in claim 1, wherein said protection layer is a photoresist layer.

12. The method as claimed in claim 1, wherein said emitter region is an $n^+$ doped polysilicon layer.

13. The method as claimed in claim 1, wherein said emitter region is an $n^+$ diffusion region formed in said base region.

14. A bipolar junction transistor made by the method claimed in claim 1, the transistor comprising:
   the n-type substrate region vertically all-through from the top side of the p-type substrate to the bottom side of the p-type substrate, wherein the n-type substrate region is surrounded and isolated by p-type substrate regions, wherein the n-type substrate region and the p-type substrate regions comprise silicon;
   the p-type diffusion region serving as the base region, and the at least one n-type diffusion region serving as a collector formed in the n-type substrate region; and
   the $n^+$-type region serving as an emitter, the $n^+$-type region comprising a doped polysilicon layer formed over the p-type diffusion region.

15. The transistor as claimed in claim 14, wherein the $n^+$-type region serving as the emitter is an $n^+$-type diffusion region formed in the p-type diffusion region to serve as the emitter.

16. A bipolar junction transistor made by the method claimed in claim 1, the transistor comprising;
   the n-type substrate region vertically all-through, wherein the n-type substrate region is surrounded and isolated by p-type substrate regions, wherein the n-type substrate region and the p-type substrate regions comprise silicon;
   the p-type diffusion region serving as the base region, and the at least one n-type diffusion region serving as a collector formed in the n-type substrate region; and the n⁺-type region serving as an emitter, the n⁺-type region comprising doped polysilicon layer formed over the p-type diffusion region:

the transistor further comprising another n⁺-type diffusion region formed in a bottom side of the n-type silicon substrate, wherein the another n⁺-type diffusion region serves as a buried layer.

17. A method of fabricating a bipolar transistor device comprising the steps of:

(a) forming a protection layer and a mask layer over a p-type silicon substrate in sequence;

(b) forming an opening by removing a portion of said mask layer to reveal said protection layer;

(c) carrying out neutron transmutation doping such that the part of said p-type substrate beneath said opening is vertically all-through transformed into an n-type substrate region;

(d) removing said mask layer and said protection layer, and then carrying out an annealing process; and (e) forming a p-type diffusion region as a base region, at least one n-type diffusion region as a collector region in said n-type substrate region, and an n⁺-type region in said base region as an emitter region, thereby fabricating a bipolar junction transistor; wherein the method further comprises:

forming an n⁺-type back diffusion region in a bottom side of said n-type substrate region, after neutron transmutation doping, and then carrying out the subsequent steps.

18. A bipolar junction transistor made by a method of fabricating a bipolar transistor device, the method comprising the steps of:

(a) forming a protection layer and a mask layer over a p-type silicon substrate in sequence;

(b) forming an opening by removing a portion of said mask layer to reveal said protection layer;

(c) carrying out neutron transmutation doping such that the part of said p-type substrate beneath said opening is vertically all-through transformed into an n-type substrate region;

(d) removing said mask layer and said protection layer, and then carrying out an annealing process; and (e) forming a p-type diffusion region as a base region, at least one n-type diffusion region as a collector region in said n-type substrate region, and an n⁺-type region in said base region as an emitter region, thereby fabricating a bipolar junction transistor; wherein the bipolar junction transistor comprises:

the n-type substrate region vertically all-through, wherein the n-type substrate region is surrounded and isolated by p-type substrate regions, wherein the n-type substrate region and the p-type substrate regions comprise silicon;

the p-type diffusion region serving as the base region, and the at least one n-type diffusion region serving as a collector formed in the n-type substrate region;

the n⁺-type region serving as an emitter, the n⁺-type region comprising a doped polysilicon layer formed over the p-type diffusion region, and another n⁺-type diffusion region formed in a bottom side of the n-type substrate, wherein the n-type substrate region is an n-type silicon substrate, and wherein the another n⁺-type diffusion region serves as a buried layer.

19. A method as claimed in claim 1, wherein in step (a) the protection layer is formed on the top side of the p-type substrate, wherein the n-type substrate region formed in step (c) has a top side and a bottom side, and wherein in step (e) the p-type diffusion region and the at least one n-type diffusion region are formed in the top side of the n-type substrate region.

20. A method as claimed in claim 2, wherein in step (a) the protection layer is formed on the top side of the p-type substrate, and wherein in step (e) the p-type diffusion region and the at least one n-type diffusion region are formed in the top side of the n-type substrate region.

21. A transistor as claimed in claim 16, wherein in step (a) the protection layer is formed on the top side of the p-type substrate, and wherein in step (e) the p-type diffusion region and the at least one n-type diffusion region are formed in the top side of the n-type substrate region.

22. The transistor as claimed in claim 14, further comprising another n⁺-type diffusion region formed in a bottom side of the n-type silicon substrate, wherein the another n⁺-type diffusion region serves as a buried layer.

23. The transistor as claimed in claim 15, further comprising another n⁺-type diffusion region formed in a bottom side of the n-type silicon substrate, wherein the another n⁺-type diffusion region serves as a buried layer.

24. A transistor as claimed in claim 14, wherein in step (a) the protection layer is formed on the top side of the p-type substrate, and wherein in step (e) the p-type diffusion region and the at least one n-type diffusion region are formed in the top side of the n-type substrate region.

25. A transistor as claimed in claim 15, wherein in step (a) the protection layer is formed on the top side of the p-type substrate, and wherein in step (e) the p-type diffusion region and the at least one n-type diffusion region are formed in the top side of the n-type substrate region.

26. A transistor as claimed in claim 16, wherein the n⁺-type region serving as the emitter is an n⁺-type diffusion region formed in the p-type diffusion region to serve as the emitter.

27. A transistor as claimed in claim 21, wherein the n⁺-type region serving as the emitter is an n⁺-type diffusion region formed in the p-type diffusion region to serve as the emitter.

* * * * *